United States Patent
Jain

(10) Patent No.: US 6,641,982 B2
(45) Date of Patent: *Nov. 4, 2003

(54) METHODOLOGY TO INTRODUCE METAL AND VIA OPENINGS

(75) Inventor: Ajay Jain, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 217 days.

This patent is subject to a terminal disclaimer.

(21) Appl. No.: 09/878,058

(22) Filed: Jun. 7, 2001

(65) Prior Publication Data

US 2002/0081532 A1 Jun. 27, 2002

Related U.S. Application Data

(63) Continuation-in-part of application No. 09/750,853, filed on Dec. 27, 2000, now Pat. No. 6,579,666.

(51) Int. Cl.[7] .................................................. G03F 7/00
(52) U.S. Cl. .................. 430/313; 430/316; 430/317; 430/322; 430/323; 430/328; 430/329; 430/396
(58) Field of Search ................................. 430/313, 316, 430/317, 322, 323, 328, 329, 396

(56) References Cited

U.S. PATENT DOCUMENTS

| 4,534,826 A | * | 8/1985 | Goth et al. ................. 438/421 |
| 5,143,820 A | | 9/1992 | Kotecha et al. ............. 430/314 |
| 5,329,161 A | * | 7/1994 | Vines et al. ................. 257/764 |
| 5,741,624 A | | 4/1998 | Jeng et al. ................... 430/312 |
| 6,107,011 A | | 8/2000 | Gelbart ....................... 430/397 |
| 6,221,680 B1 | | 4/2001 | Hakey et al. .................. 438/8 |
| 2002/0081531 A1 | | 6/2002 | Jain ............................ 430/322 |
| 2002/0081532 A1 | * | 6/2002 | Jain ............................ 430/322 |

* cited by examiner

Primary Examiner—Mark F. Huff
Assistant Examiner—Nicole Barreca
(74) Attorney, Agent, or Firm—Blakely, Sokoloff, Taylor & Zafman LLP

(57) ABSTRACT

A method including forming a photoimageable material on a substrate; developing the photoimageable material over an opening area, the photoimageable material over a first portion of the opening area developed to a first extent and the photoimageable material over a second portion of the opening area developed to a different second extent; removing developed photoimageable material from the opening area; and forming an opening in the substrate in the opening area.

22 Claims, 2 Drawing Sheets

METHODOLOGY TO INTRODUCE METAL AND VIA OPENINGS

CROSS REFERENCE TO RELATED APPLICATION

The application is a continuation-in-part application of U.S. patent application Ser. No. 09/750,853, filed Dec. 27, 2000, now U.S. Pat. No. 6,579,666, by Ajay Jain, titled "Methodology to Introduce Metal and Via Openings."

BACKGROUND OF THE INVENTION

1. Field of the Invention

The invention relates to integrated circuit processing and, more particularly, to the introduction and patterning of interconnections on an integrated circuit.

2. Description of Related Art

Modern integrated circuits use conductive interconnections to connect the individual devices on a chip or to send and/or receive signals external to the chip. Popular types of interconnections include aluminum alloy interconnections (lines) and copper interconnections (lines) coupled to individual devices, including other interconnections (lines) by interconnections through vias.

One method of forming an interconnection, particularly a copper interconnection, is a damascene process. A typical damascene process involves forming a via and an overlying trench in a dielectric to an underlying circuit device, such as a transistor or an interconnection. The via and trench are then lined with a barrier layer of a refractory material. Refractory materials include titanium nitride (TiN) and tantalum (Ta). The barrier layer serves, in one aspect, to inhibit the diffusion of the interconnection material that will subsequently be introduced in the via and trench into the dielectric. Next, a suitable seed material is deposited on the wall or walls of the via and trench. Suitable seed materials for the deposition of copper interconnection material include copper (Cu) and nickel (Ni). Next, interconnection material, such as copper, is introduced by electroplating or physical deposition in a sufficient amount to fill the via and trench and complete the interconnection structure. Once introduced, the interconnection structure may be planarized and a dielectric material (including an interlayer dielectric material) introduced over the interconnection structure to suitably isolate the structure.

In forming the via and trench for the interconnection structure, current techniques employ masking and etching operations. A first mask and etch define the via opening. Once formed, a second mask and etch is used to form the trench opening. These masking and etching operations may be reversed. Regardless, two mask and etch operations are generally required.

One problem with two mask and etch operations for defining an interconnection structure is that it is a multi-step operation to form the opening (i.e., via and trench opening). In other words, separate masks (reticles) must be formed; separate introduction and development of masking materials such as photoresist must be used; and separate etching operations to form the via and trench, respectively, must be performed.

What is needed are techniques for improving the introduction of an interconnection structure.

DETAILED DESCRIPTION

An improved method of forming an interconnection structure is disclosed. In one embodiment, the method includes introducing a photoimageable material on a substrate and developing the photoimageable material over an opening area. The photoimageable material of a first portion of the opening area is developed to a first extent and the photoimageable material over a second portion of the opening area is developed to a different second extent. Developed photoimageable material is removed from the opening area and an opening in the substrate is formed in the opening area. In terms of forming an opening for an interconnection structure, the substrate may comprise a dielectric material overlying a contact point such as a circuit element (e.g., transistor, diode, capacitor, etc.) or an underlying interconnection. In one example, the photoimageable material over the second portion of the opening area is developed to a lesser extent than the photoimageable material over the first portion of the opening area. Forming the opening in the dielectric material comprises forming the opening to a depth less than necessary to expose a contact point then removing the photoimageable material over the second portion of the opening area and exposing the contact point. In this manner, both a trench and via, for example, may be formed with a single mask or reticle.

Figure 1:
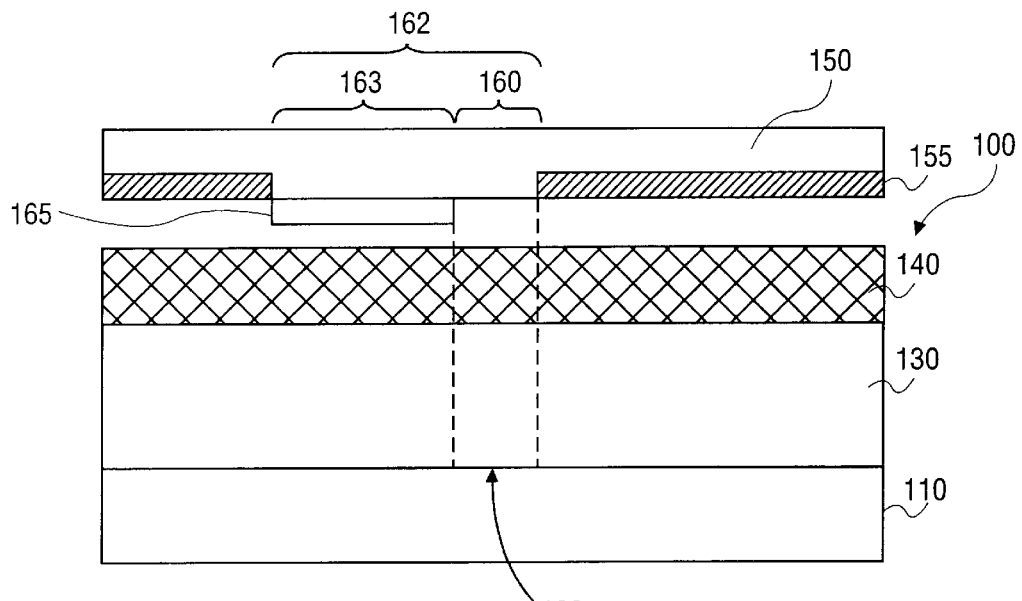
FIG. 1 shows a schematic, cross-sectional side view of a substrate comprising a dielectric layer and photoimageable material introduced over the dielectric layer, and a mask or reticle having an opening to a desired contact point.

FIG. 1 shows a typical circuit structure, such as a portion of a microprocessor chip on a silicon wafer. A typical integrated circuit such as a microprocessor chip may have, for example, four or five interconnection layers or levels separated from one another by a dielectric material. In FIG. 1, structure 100 includes substrate 110 that may be the wafer substrate having circuit elements thereon as well as one or more layers or levels of interconnection to circuit elements. FIG. 1 shows contact point 120 that may be a circuit element formed on and/or in a wafer or an interconnection line formed above the wafer to devices on the wafer. It is to be appreciated that the techniques described herein may be used for various interconnections within an integrated circuit including circuit elements and other interconnections. In this sense, contact point 120 represents wherein an interconnection contact is made.

Overlying substrate 110 and contact point 120 is dielectric material 130. Dielectric material 130 is, for example, silicon dioxide ($SiO_2$) formed by a tetraethyl orthosilicate deposition process. Other suitable materials for dielectric material 130 are also contemplated, including materials having dielectric constants less than the dielectric constant of $SiO_2$ (e.g., "low k" materials), including polymers.

Referring to FIG. 1, structure 100 is prepared for a patterning operation, specifically a photolithography operation to define an opening through dielectric material 130 to contact point 120. FIG. 1 illustrates a photolithography process using a positive photoresist methodology. A relatively non-soluble photoresist material 140 is introduced over dielectric material 130 such as, for example, by a spinning process as known in the art. It is to be appreciated that the surface of dielectric material 130 that is to receive photoimageable material 140 may be prepared as known in the art before the introduction of photoimageable material 140. For example, the surface of dielectric material 130 may be exposed to a low-temperature dehydration bake (e.g., a bake in the range of a 150 to 200° C.) and priming with, for example, hexamethyldisilazane (HMDS).

Following the introduction of photoresist material 140, mask 150 is aligned over structure 100 defining area 162 on mask 150 for light exposure to pass through and encode an image in photoresist material 140. Mask 150 is, for example, a glass (e.g., borosilicate glass or quartz) material having chrome layer 155 introduced thereon to define area 162. Mask 150 may also include a phase shift material for use in sharpening the definition of openings formed in photoresist material 140.

In this embodiment, mask 150 also includes absorption layer 165 through a portion of area 162 of mask 150 (e.g., introduced on a surface of mask 150 within area 162). Absorption layer 165 is selected to be a material, in one embodiment, that allows some light exposure through portion 163 of area 162. A suitable material and thickness for absorption layer 165 will be dependent on the wavelength of the light source.

Having properly aligned mask 150 over structure 100, the structure is exposed to a light source, such as an ultraviolet light source. In this embodiment, light from the light source passes through area 162 of mask 150. The light that passes through area 162 contacts photoresist material 140 in area 1620 corresponding to area 162 of mask 150 (e.g., by passing through the opening through the mask). The light changes the chemical structure of photoresist material 140 in area 1620 from relatively non-soluble to much more soluble. Following light exposure, a developer, such as tetramethyl ammonium hydroxide, may be used to remove the solubilized photoresist material in area 1620, while retaining the generally insoluble photoresist material over the substrate in those areas that were not exposed to light from the light source.

Figure 2:
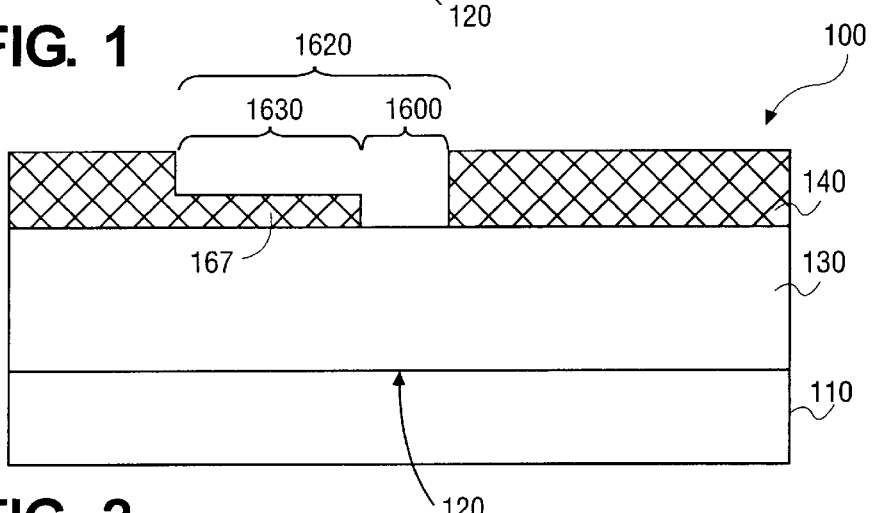
FIG. 2 shows the structure of FIG. 1 after developing a first portion of an opening area and partially developing of a second portion an opening area.

FIG. 2 shows structure 100 after light exposure, removal of mask 150, and the introduction of a developer. As can be seen, the developer removes photoresist material 140 over portion 1600 of area 1620, portion 1600 receiving the full intensity of the light exposure. Another portion of photoresist material 140 (portion 1630) of area 1620 receives less than the full intensity of light through area 1620 as a result of absorption layer 165 on mask 150 absorbing some of the light intensity. Accordingly, FIG. 2 shows photoresist material 140 over portion 1630 of area 1620 that is partially developed. Thus, when the photoresist material was exposed to a developer, only a portion of photoresist material in portion 1630 (i.e., a top portion, as viewed) is not completely removed.

Figure 3:
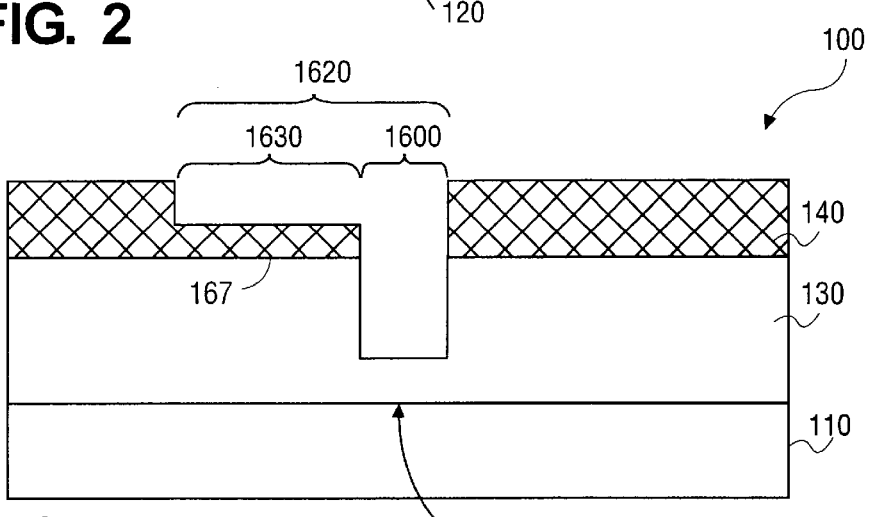
FIG. 3 shows the structure of FIG. 2 after forming an opening in the dielectric material to a depth less than necessary to expose a contact point.

Referring to FIG. 3, after defining an opening through photoresist material 140 corresponding to area 1620; specifically defining portion 160 (fully developed) and portion 1630 (partially developed), the structure is subjected to an etch, such as a plasma etch, to form an opening in dielectric material 130. In the example where dielectric material 130 is $SiO_2$, a suitable plasma etch chemistry is $CH_3/CF_4$ or $C_4F_8$. As shown in FIG. 3, the etch of dielectric material 130 defines an opening that is less than necessary to expose contact point 120. In the embodiment described, the opening formed at this point represents a portion of a via opening in dielectric material 130. The via will be accompanied by an adjacent trench formed in dielectric material 130 according to a typical damascene process arrangement. Thus, in one embodiment, the etch is stopped where the depth of the opening in dielectric material 130 is equivalent to the thickness of the dielectric layer less an effective thickness (depth) for an opening for a subsequent trench.

Figure 4:
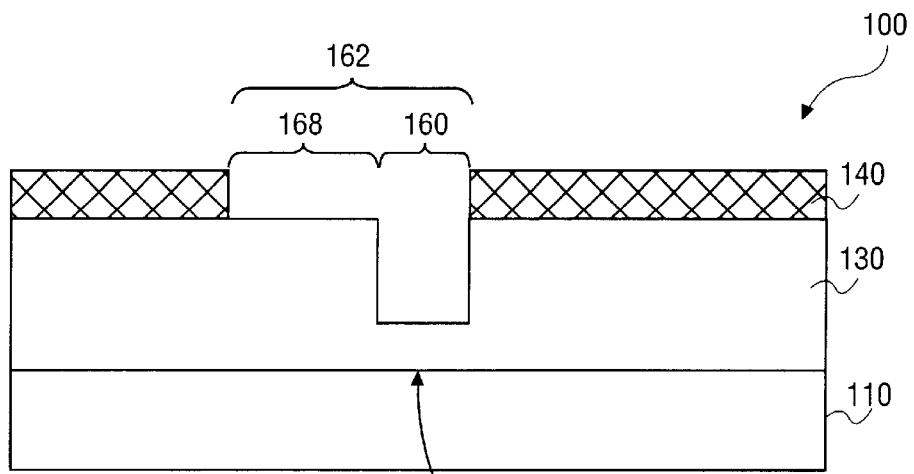
FIG. 4 shows the structure of FIG. 3 after removing the photoimageable material over the second portion of the opening area.

FIG. 4 shows the structure of FIG. 3 after the removal of partially developed portion 167 of photoresist material 140 in portion 1630 of area 1620. Partially developed photoresist material 167 may be removed by an etch process, such as an oxygen ashing, or a short exposure of structure 100 to a light source, such as an ultraviolet light source. One way the undeveloped material 167 may be exposed to a light source is by exposing structure 100 to a light source in the absence of a mask or reticle. Since photoresist material 167 has already been partially developed, the amount of light energy required to solubilize photoresist material 167 will be less than necessary to solubilize the remaining portions of photoresist material 140. FIG. 4 shows structure 100 after the removal of photoresist material 167 with, for example, a developer following light exposure. As seen in FIG. 4, the opening through photoresist material 140 corresponding to area 1620 now resembles an opening for trench formation according to a conventional damascene process.

Figure 5:
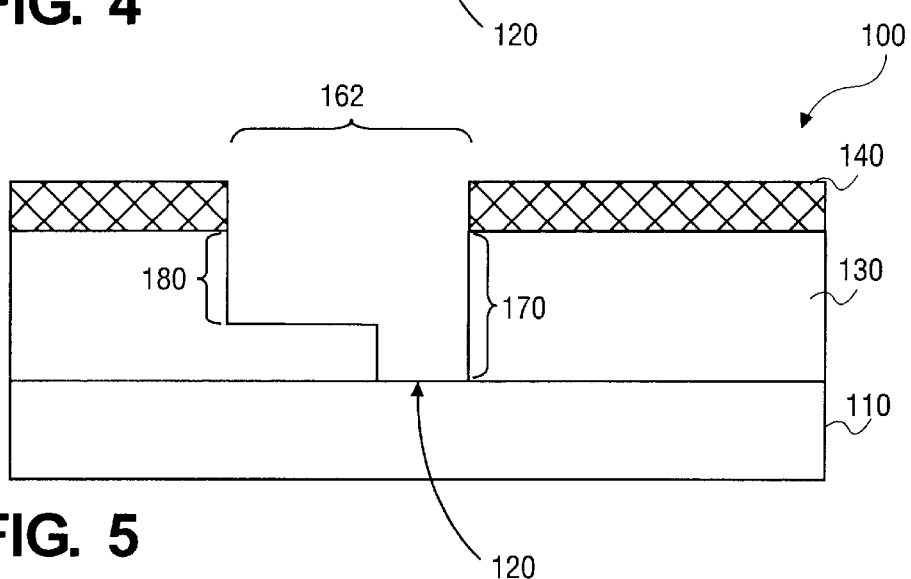
FIG. 5 shows the structure of FIG. 4 after forming an opening in the dielectric material to the contact point and defining a trench and a via over the contact point.

FIG. 5 shows the structure of FIG. 4 after an etch process (e.g., a plasma etch process) to define trench opening 180 in dielectric material 130. FIG. 5 also shows that this etch continues the earlier stopped etch of via 170. In one embodiment, the etch is sufficient to expose contact point 120 through dielectric material 130. It is to be appreciated that, in some instances, particularly where contact point 120 represents an underlying interconnection line, an etch stop material may overlie contact point 120. In such case, the opening to contact point 120 in forming the trench and via at this point is actually an etch to the etch stop, such as silicon nitride ($Si_3N_4$). A subsequent selective etch may be used to remove the etch stop material over contact point 120 without further etching the trench.

Figure 6:
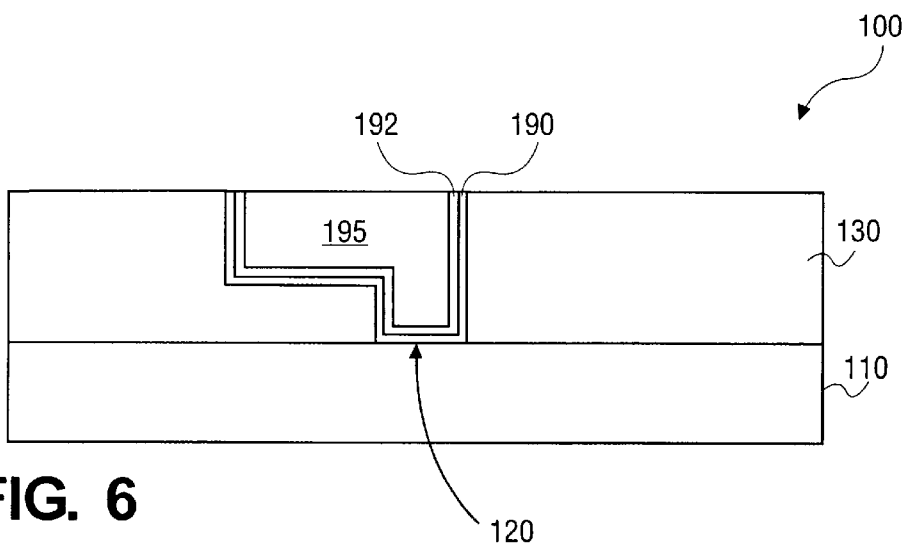
FIG. 6 shows the structure of FIG. 5 after the introduction of an interconnection structure in the opening in the dielectric material.

FIG. 6 shows the structure of FIG. 5 after the introduction of an interconnection structure. In this embodiment, the interconnection structure includes barrier material 190 of, for example, tantalum (Ta) or tantalum nitride (TaN). Interconnection structure also includes, in this embodiment, seed material 192 of, for example, a copper material and interconnection material 195 of, for example, copper. The structure is shown planarized with the surface of dielectric material 130. At this point, additional interconnection structures (e.g., lines) may be formed over the structure or, if the interconnection structure just formed represents the terminal interconnection line, suitable processing steps for encapsulating structure 100 may be introduced as known in the art.

In the preceding detailed description an improved methodology to introduce trench and via openings is presented. In one aspect, the definition of a trench and via used, for example, in a damascene process, may be defined in essentially a single masking operation by controlling the transfer of photoresist over a substrate to define a trench and via. It is appreciated that the demonstration of this technique with respect to interconnection patterning (specifically damascene process patterning) is representative of the invention as is the specific patterning technique described. The invention may find utility in any operation where, for example, multiple masking operations are typically required to form an opening in a material layer.

The invention is described with reference to specific embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. A method comprising:
    forming a photoimageable material on a dielectric material overlying a contact point;
    developing the photoimageable material over an opening area, the photoimageable material over a first portion of the opening area developed to a first extent and the photoimageable material over a second portion of the opening area developed to a lesser second extent;
    forming an opening in the dielectric material about the opening area to a depth equivalent to the thickness of the dielectric layer less an effective thickness for an opening about a second opening area;
    removing photoimageable material over the second portion of the opening area;
    after removing the photoimageable material, forming an opening in the dielectric material to the contact point about the opening area and forming an opening in the dielectric material about the second opening area; and
    after forming the opening in the dielectric material to the contact point and the opening in the dielectric material about the second opening area, forming an interconnect coupled to the contact point.

2. The method of claim 1, wherein forming each opening comprises a plasma etch using one of $CH_3$, $CF_4$, and $C_4F_8$.

3. The method of claim 1, wherein developing the photoimageable material comprises:
    exposing the photoimageable material over the opening area to light energy from a light source, wherein the photoimageable material over the first portion of the opening is exposed to more light energy than the photoimageable material over the second portion of the opening area.

4. A method comprising:
    forming a photoimageable material over a dielectric material on a substrate;
    developing the photoimageable material by exposing the photoimageable material to a light source through an exposure mask;
    defining an opening in the photoimageable material, the opening comprising a first opening portion exposing the dielectric material therethrough and a second portion less than completely through retaining a portion of the photoimageable material;
    retaining a third portion of the photoimageable material that is greater in thickness than the second portion retained portion of the photoimageable material; and
    forming an opening in the dielectric material defined by the opening in the photoimageable material, wherein forming the opening in the dielectric comprises:
        forming the opening to a depth less than necessary to expose a contact point;
        removing the retained photoimageable material over the second portion of the opening exposing the dielectric material through the second opening portion, wherein removing the retained photoimageable material comprises exposing the photoimageable material of the first, second, and third portions to a light source; and
        after removing the photoimageable material, exposing the contact point.

5. The method of claim 4, wherein removing the retained photoimageable material comprises exposing the photoimageable material in the absence of a mask.

6. The method of claim 4, wherein the light source includes light energy sufficient to remove the retained photoimageable material over the second portion and retain a portion of the photoimageable material over the third portion.

7. The method of claim 4, wherein the exposure mask comprises one of a glass, a borosilicate glass, a quartz, and a chrome.

8. The method of claim 4, wherein the exposure mask comprises a phase shift material to sharpen the definition of the openings formed in the photoimageable material.

9. The method of claim 4, wherein the exposure mask comprises at least one absorption layer material that allows some light exposure through an exposure mask portion.

10. The method of claim 9, wherein the absorption layer material comprises a material thickness for absorbing at least some of a wavelength of light of the light source.

11. The method of claim 9, further comprising aligning the exposure mask over the photoimageable material so that a portion of light from the light source passes through the absorption layer and contacts the second portion of the photoimageable material.

12. The method of claim 4, wherein said light source comprises an ultraviolet light source.

13. The method of claim 4, wherein developing the photoimageable material comprises developing through a single exposure mask with a single exposure.

14. The method of claim 4, wherein developing comprises:
    prior to exposing the photoimageable material to a light source, forming an energy absorbing material between the light source and the photoimageable material over the second opening portion.

15. The method of claim 4, wherein the dielectric material overlies the contact point and exposing the contact point comprises forming a second opening to the contact point at the first portion.

16. The method of claim 15, wherein forming an opening to a depth less than necessary to expose the contact point comprises forming the opening to a depth equivalent to the thickness of the dielectric layer less an effective thickness for an opening about the second opening portion.

17. A method comprising:
    developing a first portion of photoimageable material over an opening area of a dielectric material;
    leaving undeveloped photoimageable material in a second portion of photoimageable material at a second area designated for an opening through a dielectric material;
    retaining a third portion of photoimageable material that is greater in thickness than the second portion of photoimageable material;
    forming a first opening in the opening area in the dielectric material at the first portion of photoimageable material to a depth equivalent to the thickness of the dielectric material less a selected depth for the second portion of the opening;

after forming the first opening, removing the undeveloped photoimageable material at the second portion of photoimageable material; and after removing the undeveloped photoimageable material, forming a second opening in the dielectric material at the first portion of photoimageable material to define a substrate via opening in the dielectric layer and a third opening in the dielectric material at the second portion of photoimageable material to define a substrate trench opening in the dielectric layer; and after forming the second opening in the dielectric material at the first portion, forming an interconnect coupled to the contact point.

18. The method of claim 17, wherein forming leach of the first, second, and third openings comprise a plasma etch using one of $CH_3$, $CF_4$, and $C_4F_8$.

19. The method of claim 17, wherein forming the second opening comprises extending the first opening through the dielectric material to a contact point.

20. The method of claim 17, wherein developing comprises completely developing the first portion of the photoimageable material over the first area designated.

21. The method of claim 17, wherein forming a first opening comprises forming an opening in a first portion of the area and forming the third opening comprises forming an opening in a second portion different than the first portion.

22. The method of claim 17, wherein developing the photoimageable material comprises developing through a single exposure mask with a single exposure.

* * * * *

UNITED STATES PATENT AND TRADEMARK OFFICE
CERTIFICATE OF CORRECTION

PATENT NO. : 6,641,982 B2
DATED : November 4, 2003
INVENTOR(S) : Jain

It is certified that error appears in the above-identified patent and that said Letters Patent is hereby corrected as shown below:

<u>Column 7,</u>
Line 14, delete "leach" and insert -- each --.

Signed and Sealed this

Third Day of February, 2004

JON W. DUDAS
*Acting Director of the United States Patent and Trademark Office*